(12) United States Patent
Kim

(10) Patent No.: US 9,698,733 B2
(45) Date of Patent: Jul. 4, 2017

(54) APPARATUS AND METHOD FOR AMPLIFYING SIGNAL

(71) Applicant: SAMSUNG ELECTRONICS CO., LTD., Suwon-si (KR)

(72) Inventor: Jong Pal Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/190,698

(22) Filed: Feb. 26, 2014

(65) Prior Publication Data
US 2014/0285257 A1    Sep. 25, 2014

(30) Foreign Application Priority Data
Mar. 20, 2013 (KR) .......... 10-2013-0029586

(51) Int. Cl.
*H03F 1/02* (2006.01)
*H03F 1/26* (2006.01)
*H03F 3/45* (2006.01)

(52) U.S. Cl.
CPC ........... *H03F 1/26* (2013.01); *H03F 3/45183* (2013.01); *H03F 3/45968* (2013.01)

(58) Field of Classification Search
CPC ..................................... H03F 1/02; H03F 1/30
USPC ..................................... 330/9, 297, 285, 296
See application file for complete search history.

(56) References Cited

U.S. PATENT DOCUMENTS

| | | | | |
|---|---|---|---|---|
| 2,252,059 A | * | 8/1941 | Barth | G01R 33/045 102/417 |
| 2,414,432 A | * | 1/1947 | Armstrong | H01H 43/005 335/63 |
| 2,707,266 A | * | 4/1955 | Doll | G01V 3/20 324/353 |
| 2,712,627 A | * | 7/1955 | Doll | G01V 3/20 324/352 |
| 4,039,980 A | * | 8/1977 | Nagahama | G10H 1/14 330/145 |
| 4,490,682 A | | 12/1984 | Poulo | |
| 5,489,873 A | * | 2/1996 | Kamata | H03D 3/22 327/558 |
| 5,745,587 A | * | 4/1998 | Statz | H03F 3/3066 330/263 |
| 6,346,856 B1 | * | 2/2002 | Myers | H03F 3/45511 330/252 |
| 7,432,766 B2 | | 10/2008 | Gerstenhaber et al. | |
| 7,929,938 B2 | * | 4/2011 | Sellars | H03D 7/1441 327/113 |
| 8,253,492 B2 | * | 8/2012 | Hijikata et al. | 330/285 |
| 8,890,616 B2 | * | 11/2014 | Scott | H03G 3/3042 330/285 |
| 8,970,199 B2 | * | 3/2015 | Scoones | H02M 1/32 323/285 |

(Continued)

FOREIGN PATENT DOCUMENTS

JP    07-094973 A    4/1995
JP    2008-306360 A    12/2008
(Continued)

*Primary Examiner* — Henry Choe
(74) *Attorney, Agent, or Firm* — NSIP Law

(57) ABSTRACT

An apparatus that amplifies a signal, includes an amplifier configured to amplify the signal. The apparatus further includes a current supplier configured to supply a periodically variable current to the amplifier.

21 Claims, 12 Drawing Sheets

(56) References Cited

U.S. PATENT DOCUMENTS

2010/0052789 A1\* 3/2010 Bakalski et al. .............. 330/285

FOREIGN PATENT DOCUMENTS

| JP | 4852021 B2 | 10/2011 |
| KR | 10-1114674 B1 | 5/2012 |
| KR | 10-2012-0111268 A | 10/2012 |

\* cited by examiner

APPARATUS AND METHOD FOR AMPLIFYING SIGNAL

CROSS-REFERENCE TO RELATED APPLICATION

This application claims the benefit under 35 USC 119(a) of Korean Patent Application No. 10-2013-0029586, filed on Mar. 20, 2013, in the Korean Intellectual Property Office, the entire disclosure of which is incorporated herein by reference for all purposes.

BACKGROUND

1. Field

The following description relates to an apparatus and a method for amplifying a signal.

2. Description of Related Art

An instrumentation amplifier (IA) may be used to measure various signals. For example, the IA may be used to measure a biosignal, such as an electrocardiogram (ECG), an electromyogram (EMG), an electroencephalogram (EEG), a pressure, a body resistance, and a motion signal, in the medical field.

Generally, the IA may be configured by a low offset, weak noise, a high common mode rejection, a high roof gain, and a differential amplifier representing a high input resistor. The IA may include a discrete time-switched capacitor structure to obtain a discrete signal sample.

The IA may include a chopper circuit to modulate a signal to a high frequency to remove noise and an offset. The chopper circuit may re-modulate the modulated signal modulated to a low frequency.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus that amplifies a signal, includes an amplifier configured to amplify the signal. The apparatus further includes a current supplier configured to supply a periodically variable current to the amplifier.

The current supplier may be configured to supply, to the amplifier, currents including different amplitudes in an alternating manner to modulate the signal from a lower frequency to a higher frequency with the currents.

The current supplier may be configured to supply, to the amplifier, currents including different amplitudes in an alternating manner, using transistors including different properties.

The current supplier may be configured to determine a change interval of the current based on a sampling interval of the amplified signal.

The current supplier may be configured to supply, to the amplifier, a first current and a second current including different respective amplitudes in an alternating manner. An amplitude of the second current may be zero or less than an amplitude of the first current.

The current supplier may be configured to adjust a ratio between a duration of supplying the first current to the amplifier and a duration of supplying the second current to the amplifier to control an amount of the periodically variable current.

The current supplier may be configured to adjust the amplitude of the second current to control an amount of the periodically variable current.

The amplifier may be configured to determine regular sampling intervals based on a change interval of the current, and sample the amplified signal at the regular sampling intervals.

The amplifier may include a current mirror including an input resistor and an output resistor, and a buffer configured to output the signal to ends of the input resistor. The current mirror may be configured to mirror a current flowing in the input resistor, and output the mirrored current in an output resistor.

The amplifier may be configured to amplify the signal based on a ratio between the output resistor and the input resistor.

The amplifier may further include a bootstrap circuit connected to the buffer and configured to prevent a property of the buffer from changing.

A frequency of the periodically variable current may be greater than a bandwidth of the signal.

In another general aspect, an apparatus that amplifies a signal, includes a circuit configured to generate a higher quality analog signal in a time interval adjacent to a time of transitioning from a sampling to a holding of an analog signal, and generate a lower quality analog signal in a remaining time interval.

In still another general aspect, a method of amplifying a signal, includes modulating the signal from a lower frequency to a higher frequency with a periodically variable current. The method further includes amplifying the modulated signal, and sampling the amplified signal.

The modulating may include modulating the signal from the lower frequency to the higher frequency with currents including different amplitudes in an alternating manner.

The modulating may include determining regular change intervals based on a sampling interval of the amplified signal, and modulating the signal from the lower frequency to the higher frequency with currents including different amplitudes at the regular change intervals.

The modulating may include modulating the signal from the lower frequency to the higher frequency with currents including different amplitudes, using transistors including differing properties.

The amplifying may include amplifying the modulated signal, using a current mirror mirroring a current corresponding to the modulated signal.

The sampling may include determining regular sampling intervals based on a change interval of the current, and sampling the amplified signal at the regular sampling intervals.

The method may further include filtering the sampled signal, using a low pass filter.

In yet another general aspect, an apparatus includes an amplifier configured to modulate a signal from a lower frequency to a higher frequency with a periodically variable current, and amplify the modulated signal.

The amplifier may be further configured to sample the amplified signal to modulate the amplified signal to the lower frequency.

The periodically variable current may include a first amplitude in a sampling time interval in which the amplified signal is sampled, and a second amplitude less than the first amplitude in a remaining time interval.

Other features and aspects will be apparent from the following detailed description, the drawings, and the claims.

Figure 1:
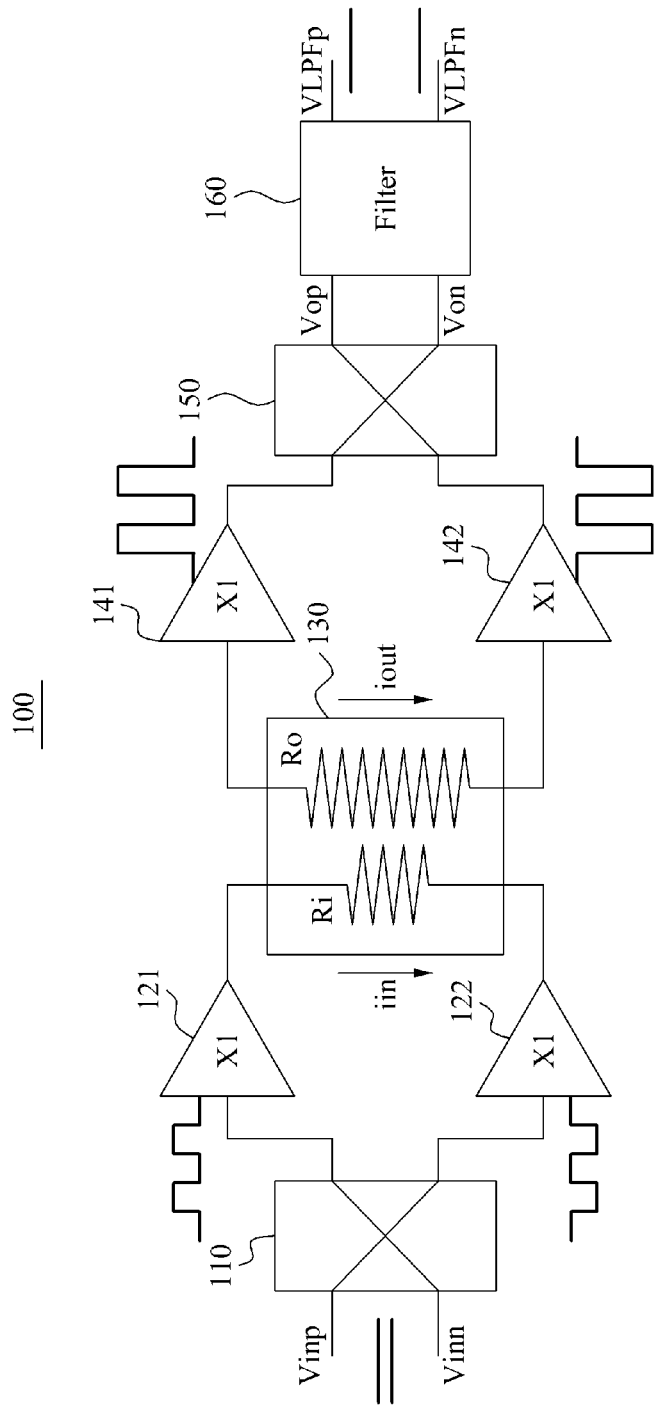
FIG. 1 is a diagram illustrating an example of a conventional apparatus that amplifies a signal.

Throughout the drawings and the detailed description, unless otherwise described, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 illustrates an example of a conventional apparatus 100 that amplifies a signal. Referring to FIG. 1, the conventional apparatus 100 includes an input chopper 110, an input buffers 121 and 122, a current mirror 130, an output buffers 141 and 142, an output chopper 150, and a filter 160.

The input chopper 110 modulates an input signal Vinp or Vinn to a high frequency to remove noise and an offset. The input buffers 121 and 122 transfer the modulated input signal fin to the current mirror 130, namely, an input resistor Ri. The current mirror 130 mirrors the modulated input signal iin to generate a mirrored signal iout to an output resistor Ro. The output buffers 141 and 142 transfer the mirrored signal iout to the output chopper 150. The output chopper 150 modulates the mirrored signal iout to a signal Vop or Von of a low frequency. The filter 160 filters of the signal Vop or Von to generate an output signal VLPFp or VLPFn.

Figure 2:
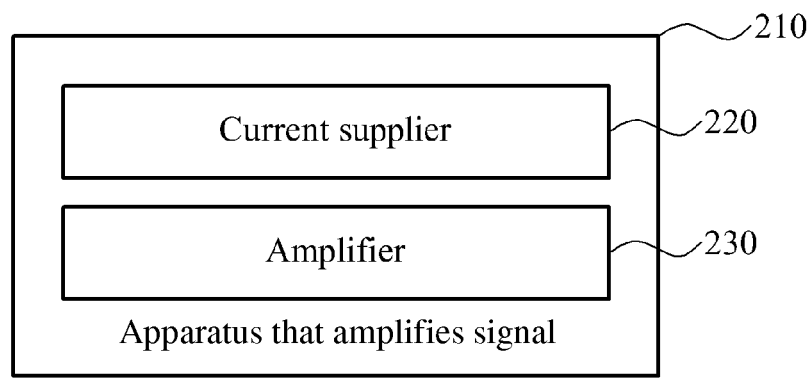
FIG. 2 is a diagram illustrating an example of an apparatus that amplifies a signal.

FIG. 2 illustrates an example of an apparatus 210 that amplifies a signal. Referring to FIG. 2, the apparatus 210 includes a current supplier 220 and an amplifier 230. The apparatus 210 amplifies an input signal, and outputs the amplified input signal. For example, the apparatus 210 may refer to an instrumentation amplifier (IA) that outputs a biosignal through amplifying the biosignal, such as an electrocardiogram (ECG), an electromyogram (EMG), an electroencephalogram (EEG), a pressure, a body resistance, a motion signal, and/or other biosignals known to one of ordinary skill in the art, in an analogue front-end (AFE).

The apparatus 210 modulates the input signal to an input signal of a high or higher frequency in order to minimize an effect of flicker noise, or 1/f noise, generated in an active device, such as a transistor, prior to amplifying the input signal. The apparatus 210 may modulate the input signal of a low or lower frequency to the input signal of the high frequency through supplying a variable current. For example, the apparatus 210 may supply currents including differing amplitudes to an internal circuit, in an alternating manner, and modulate the input signal of the low frequency to the input signal of the high frequency.

The apparatus 210 may modulate the input signal of the low frequency to the input signal of the high frequency through adjusting the current to be supplied to the internal circuit without using a predetermined circuit, for example, a chopper. Accordingly, the apparatus 210 may generate a high or higher quality output signal because the apparatus 210 is not influenced by noise induced by the chopper.

In more detail, the apparatus 210 may supply a current of a normal amplitude in a predetermined time interval, rather than supply the current of the normal amplitude to the internal circuit. During another time interval, the apparatus 210 may supply a current of an amplitude less than the current of the normal amplitude, or block the supplying of the current.

Figure 12:
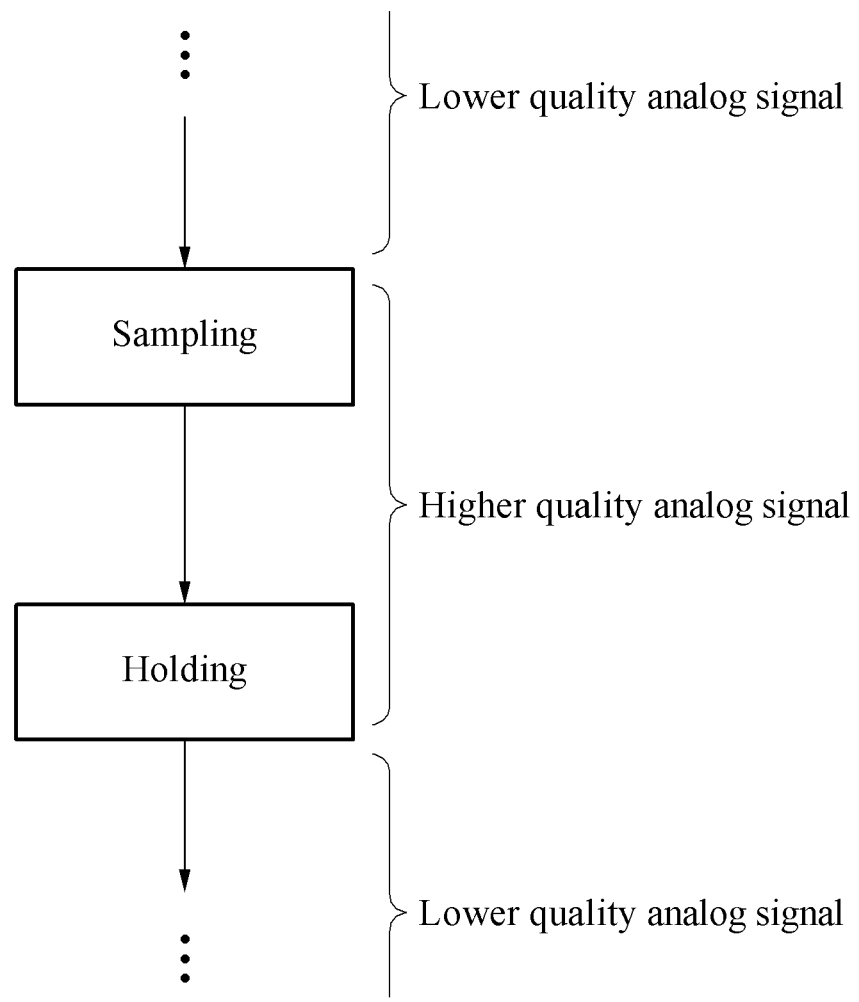
FIG. 12 is an example of a high quality analog signal in a time interval adjacent to a point in time of transitioning from a sampling to a holding of the analog signal.

As depicted in FIG. 12, the apparatus 210 may generate a high or higher quality analog signal in a time interval adjacent to a point in time of transitioning from a sampling to a holding of the analog signal, and generate a low or lower quality analog signal in a remaining time interval. The high quality analog signal may include less noise and more amplification than the low quality analog signal. The apparatus 210 may form the high quality analog signal in a vicinity of a sampling point in time at which the amplified input signal is sampled, and form the low quality analog signal in a remaining time interval, such that an average power consumed by the apparatus 210 may be reduced without an occurrence of a deterioration of an output signal.

The apparatus 210 may modulate the input signal of the high frequency to a signal of a low frequency, and output the signal of the low frequency when the amplifying of the input signal is completed. Distinguishing between the input signal of the high frequency and the signal of the low frequency may be determined by a relative comparison between the signals with respect to a frequency amplitude.

The current supplier 220 supplies a variable current to the amplifier 230. In more detail, the current supplier 220 may supply a periodically variable current to the amplifier 230. The current supplier 220 may supply currents including differing amplitudes to the amplifier 230, in an alternating manner, and modulate an input signal of a low frequency to an input signal of a high frequency.

For example, the current supplier 220 may supply the currents including the differing amplitudes to the amplifier 230, in the alternating manner, using transistors including differing properties. The current supplier 220 may include the transistors including the differing properties, and control ON/OFF states of the respective transistors to generate the periodically variable current.

Figure 11:
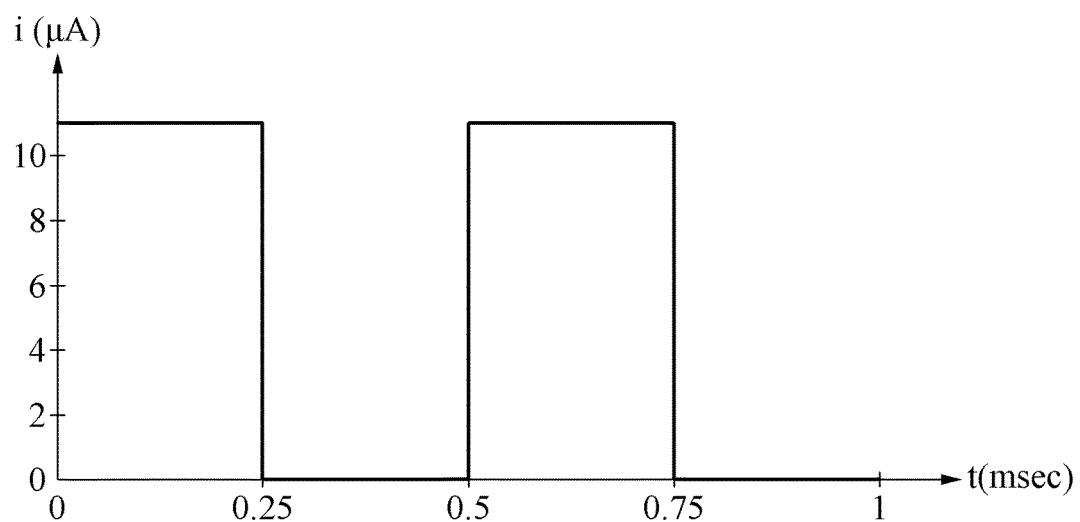
FIG. 11 is an example of an amplitude of a first current and a second current of the current supplier depicted in FIGS. 2-6.

In even more detail, the current supplier 220 may supply a first current and a second current including differing amplitudes to the amplifier 230, in an alternating manner. The first current may refer to a current needed for the amplifier 230 to form a high quality signal. As depicted in FIG. 11, the amplitude of the second current may be zero, or less than the amplitude of the first current. The amplitude of the second current being zero may indicate that the current supplier 220 may not supply a current to the amplifier 230 in a predetermined time interval. The current supplier 220 may adjust the amplitude of the second current based on a start time, a sampling interval in which an amplified input signal is sampled, an operation performance of the amplifier 230 based on the current amplitude to be supplied, and/or other factors known to one of ordinary skill in the art.

The current supplier 220 may control an amount of the current to be supplied to the amplifier 230 through adjusting a ratio between a duration of supplying the first current to the amplifier 230 and a duration of supplying the second current to the amplifier 230. Alternatively, the current supplier 220 may control the amount of the current to be supplied to the amplifier 230 through adjusting the amplitude of the second current. The current supplier 220 may control a power consumed by the amplifier 230 through adjusting the ratio between the duration of supplying the first current to the amplifier 230 and the duration of supplying the second current to the amplifier 230, or adjusting the amplitude of the second current.

The current supplier 220 may determine a change interval of the current to be supplied to the amplifier 230 based on the sampling interval in which the amplified input signal is sampled. For example, the current supplier 220 may determine a time interval in which the first current and the second current are supplied to the amplifier 230, based on the sampling interval. Alternatively, the amplifier 230 may determine the sampling interval based on the change interval of the current to be supplied to the amplifier 230.

The change interval of the current may indicate a time unit in which the current supplier 220 supplies the currents including the differing amplitudes to the amplifier 230. For example, when the current supplier 220 supplies a current of 11 microamperes (μA) for 0.25 milliseconds (msec) initially, and then repeatedly supplies a current of 3 μA for 0.25 msec, the change interval of the current may be 0.5 msec.

When the amplified input signal is sampled in a process of an analog-to-digital conversion (ADC), a signal quality at a sampling point in time may affect a quality of an output signal. Conversely, a signal quality at another point in time, aside from the sampling point in time, may be irrelevant to the output signal to be generated.

The current supplier 220 may maintain the high quality signal through supplying a current of a high amplitude in an interval adjacent to the sampling point in time, and reduce an average current consumed by the amplifier 230 through supplying a current of a relatively low amplitude in a remaining time interval.

The amplifier 230 amplifies an input signal, and outputs the amplified input signal. The amplifier 230 may amplify an input signal modulated by variably supplying a current, and output the amplified input signal at regular sampling intervals. The regular sampling intervals may include a predetermined value, or may be determined based on a change interval of a current to be supplied to the amplifier 230 by the current supplier 220. The regular sampling intervals may be identical to the change interval of the current.

The amplifier 230 may modulate a signal modulated to a high frequency to a signal of a low frequency through a sampling process. Also, the amplifier 230 may convert an input signal, for example, an analog signal, to a digital signal through the sampling process. The amplifier 230 may selectively perform a low pass filtering to remove switching noise, and/or other noise known to one of ordinary skill in the art, generated in the sampling process.

The amplifier 230 may include at least one input buffer (not shown) that outputs an input signal to both ends of an input resistor, and a current mirror (not shown) that runs a mirrored current to an output resistor through mirroring a current flowing in the input resistor. Also, the amplifier 230 may be connected to an input buffer, and may further include a bootstrap circuit connected to the input buffer that prevents a characteristic of the input buffer from changing based on an amplitude of the input signal. Descriptions of the input buffer, the current mirror, and the bootstrap circuit will be discussed in detail later.

Figure 3:
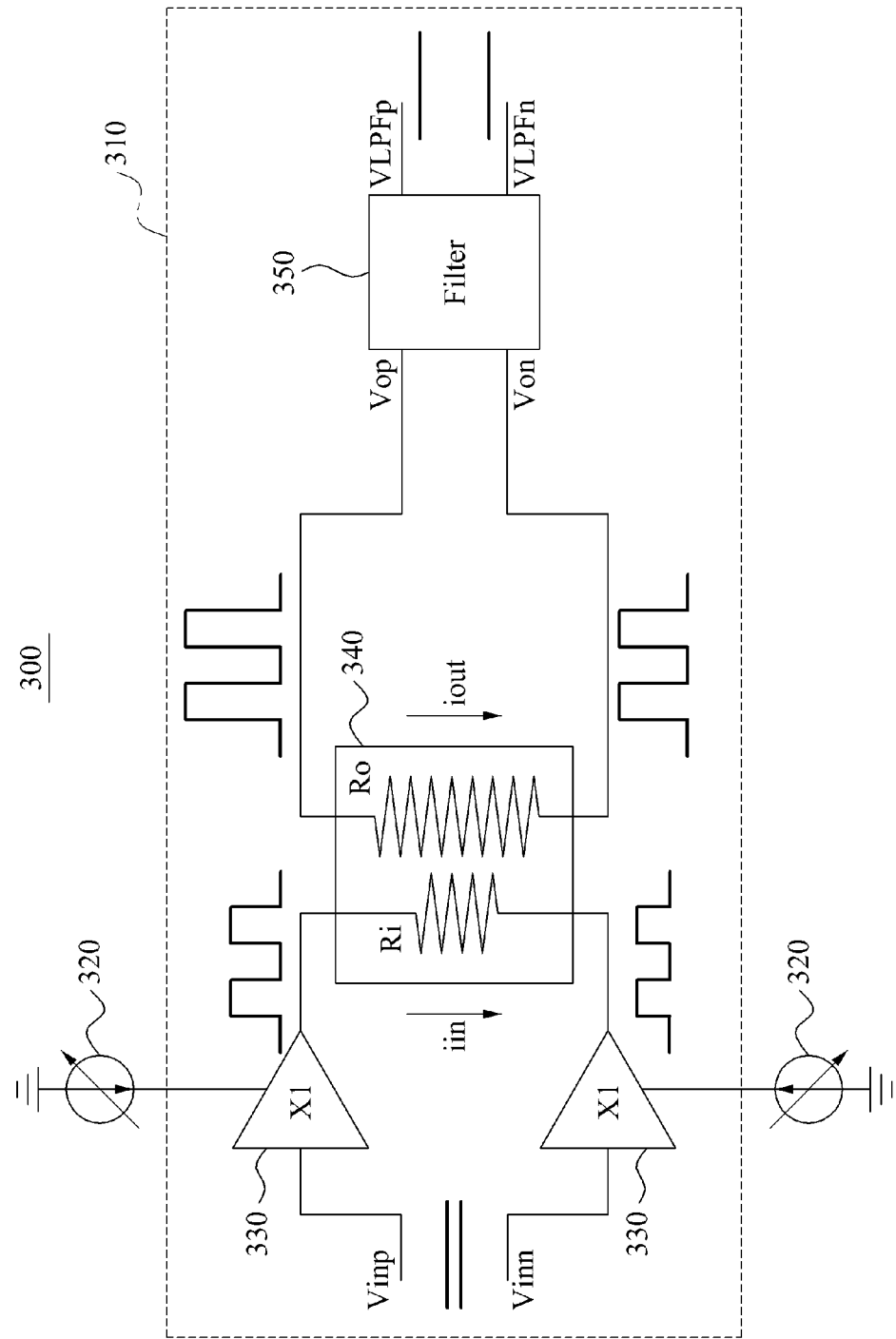
FIG. 3 is a diagram illustrating an example of an operation of an apparatus that amplifies a signal.

FIG. 3 illustrates an example of an operation of an apparatus 300 that amplifies a signal. Referring to FIG. 3, the apparatus 300 includes an amplifier 310 and a current supplier 320. The amplifier 310 includes an input buffer 330, a current mirror 340, and a filter 350. Also, the amplifier 310 may further include a bootstrap circuit (not shown) that prevents a characteristic of the input buffer 330 from changing based on an amplitude of an input signal. Also, the amplifier 310 may further include a buffer (not shown) inserted between the current mirror 340 and the filter 350.

Figure 10:
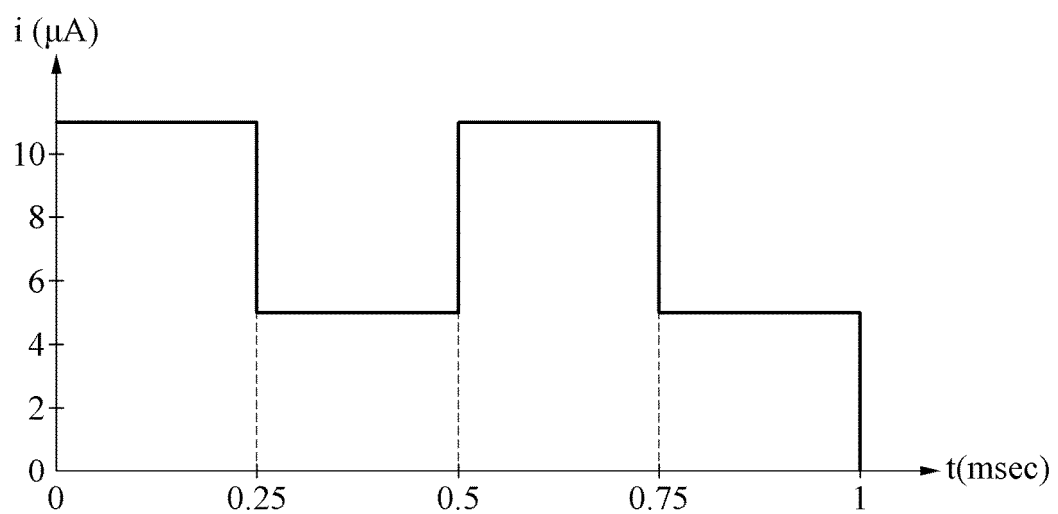
FIG. 10 is an example of currents of different amplitudes being supplied to the internal circuit of the amplifier depicted in FIG. 3.

The input buffer 330 outputs an input signal Vinn, Vinp to both ends of an input resistor Ri so that an input current iin flows through the input resistor Ri. The current supplier 320 supplies a periodically variable current to an internal circuit of the amplifier 310. In more detail, the current supplier 320 may supply currents including differing amplitudes to the internal circuit at regular intervals, in an alternating manner. For example, as depicted in FIG. 10, a single set of a change interval of a current is assumed to be 0.5 msec, the current supplier 320 may initially supply a current of 11 μA to the amplifier 310 for 0.25 msec, and supply a current of 3 μA to the amplifier 310 for 0.25 msec.

The input signal Vinn, Vipp of a low or lower frequency that is inputted to the input buffer 330 is modulated to a high or higher frequency through the current supplier 320 supplying the periodically variable current to the internal circuit of the amplifier 310. The input buffer 330 processing the input signal Vinn, Vinp variably consumes the current received from the current supplier 320.

The input signal of the high frequency may form the input current fin at both of the ends of the input resistor Ri. The current mirror 340 mirrors the input current iin to generate and output an output current iout through both ends of an output resistor Ro. When the current mirror 340 outputs, through both of the ends of the output resistor Ro, the output current iout of which an amplitude is equal to an amplitude of the input current iin, an output signal Von, Vop amplified based on a ratio between the output resistor Ro and the input resistor (Ri) may be generated at the both of the ends of the output resistor Ro.

Also, the current mirror 340 may output, through both of the ends of the output resistor Ro, the output current iout of which the amplitude is unequal to the amplitude of the input signal fin, based on a configuration of an internal circuit or a characteristic of a transistor. When the current mirror 340 outputs, through both of the ends of the output resistor Ro, the output current iout of which the amplitude is unequal to the amplitude of the input signal fin, an amplitude of the output signal Von, Vop may be determined based on the ratio between the output resistor Ro and the input resistor Ri and a ratio between the output current iout and the input current fin.

The amplifier 310 may sample the amplified output signal Von, Vop at regular sampling intervals to modulate the amplified output signal Von, Vop to a low frequency. That is, the input signal Vinp, Vinn may be modulated to the high frequency by the current supplier 320 supplying the variable current, and modulated to the output signal Von, Vop of the low frequency through a sampling process performed at an output end. A frequency variation of the variable current outputted by the current supplier 320 may be higher than a bandwidth of the input signal Vinp, Vinn because the input signal Vinp, Vinn may be modulated to the high frequency by the variable current.

A sampling interval may include a predetermined value, or may be determined based on a change interval of the variable current to be supplied to the amplifier 310 by the current supplier 320. The sampling interval may be identical to a change interval of the variable current or the currents including the differing amplitudes that are supplied by the current supplier 320. For example, when the change interval of the current is 0.5 msec, the sampling interval may be determined to be 0.5 msec.

Alternatively, the change interval of the current of the current supplier 320 may be determined based on a predetermined sampling interval. For example, when the sampling interval performed at an output end of the amplifier 310 is 0.5 msec, the current supplier 320 may determine the change interval of the current to be 0.5 msec.

The filter 350 filters the sampled output signal Von, Vop, using a low pass filter (LPF) in order to remove switching noise generated in the sampling process. Accordingly, the filter 350 generates and outputs a high quality output signal VLPFp, VLPFn from which noise is removed through the filtering process.

According to another example, the apparatus 300 that amplifies the signal operates based on the conventional chopping method of FIG. 1. For example, during a time period of 125 μsec of Phase 1, Vinp is connected to an upper input buffer 121, Vinn is connected to a lower input buffer 122, an upper output buffer 141 is connected to Vop, and a lower output buffer 142 is connected to Von. In Phase 1, the apparatus 300 that amplifies the signal supplies a relatively high level of current to the upper input buffer 121, the lower input buffer 122, the upper output buffer 141, and the lower output buffer 142 in order to generate a high quality signal. During a time period of 125 sec of Phase 2, being a step subsequent to Phase 1, Vinp is connected to the lower input buffer 122, Vinn is connected to the upper input buffer 121, the upper output buffer 141 is connected to Von, and the lower output buffer 142 is connected to Vop. In Phase 2, the apparatus 300 that amplifies the signal supplies a relatively low level of current to the upper input buffer 121, the lower input buffer 122, the upper output buffer 141, and the lower output buffer 142, or blocks the supplied current. Phase 1 and Phase 2 are operated continuously over a period of time. A sampling unit (not shown) may be added to a front end of the filter 160. Upon entering a current Phase 1 from a previous Phase 2, the sampling unit commences a sampling operation subsequent to a sufficient period of time elapsing from a start time of the current Phase 1, during which a Vop signal and a Von signal are stabilized, and ends the sampling operation prior to an output signal of the sampling unit being sufficiently stabilized by performing the sampling from an end time of Phase 1.

Figure 4:
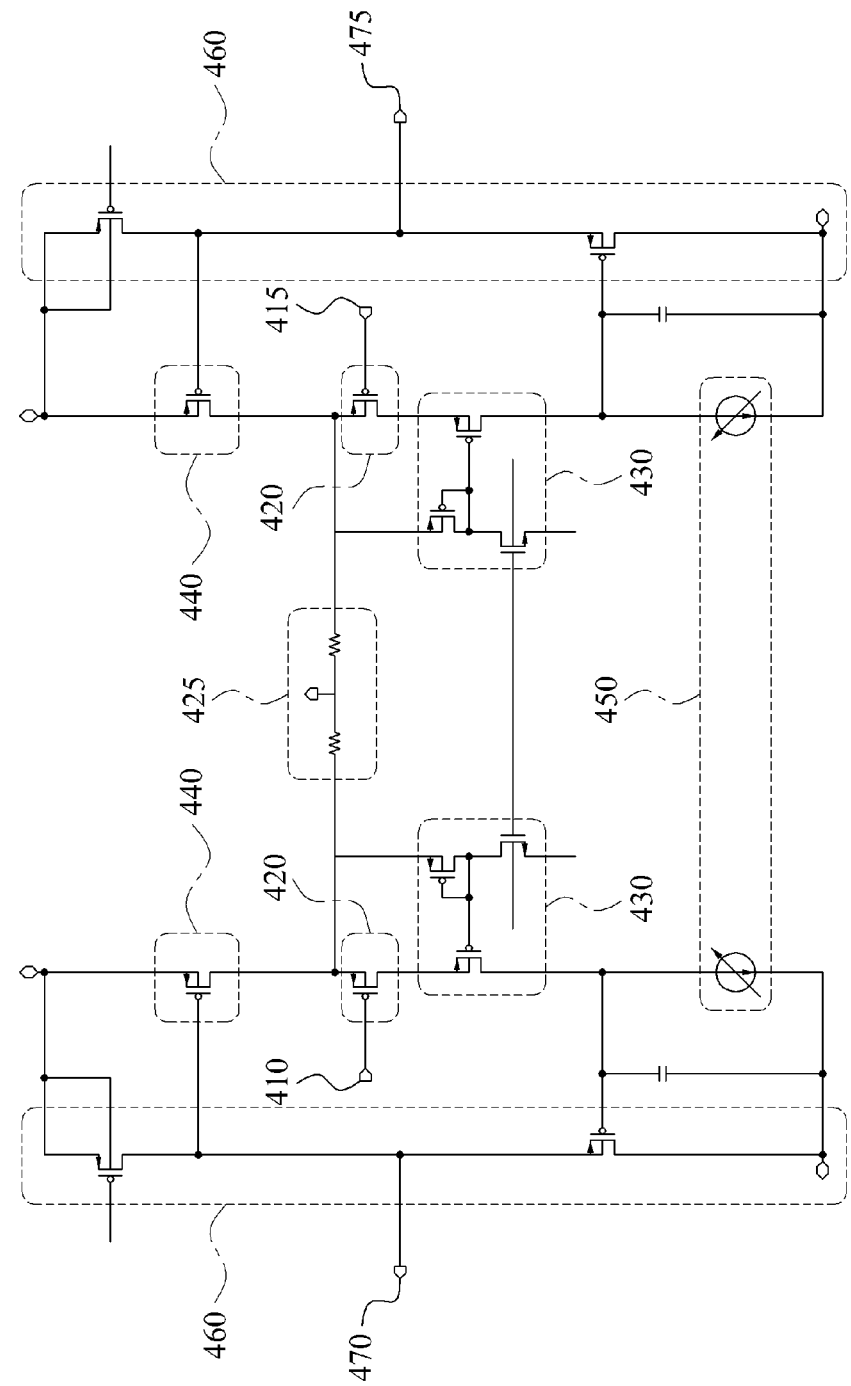
FIGS. 4 and 5 are diagrams illustrating examples of a first circuit and a second circuit that implement an apparatus that amplifies a signal.
Figure 5:
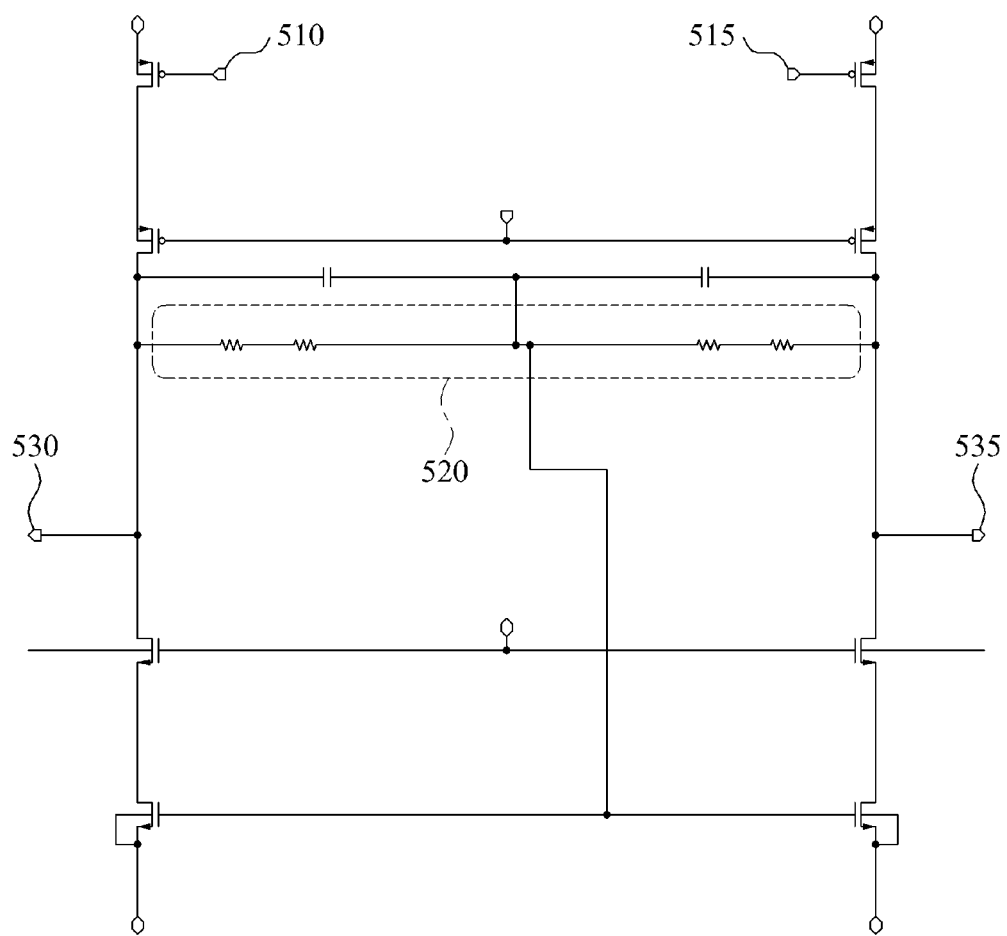

FIGS. 4 and 5 illustrate examples of a first circuit 400 and a second circuit 500 that implement an apparatus that amplifies a signal. The first circuit 400 illustrated in FIG. 4 and the second circuit 500 illustrated in FIG. 5 operate through being connected to one another. FIG. 4 illustrates the first circuit 400 that implements the apparatus that amplifies the signal. An input signal is inputted to input nodes 410 and 415 of the first circuit 400. An input buffer 420 outputs the input signal to both ends of an input resistor 425.

A bootstrap circuit 430 connected to the input buffer 420 prevents a characteristic of the input buffer 420 from changing based on an amplitude of the input signal. For example, the input buffer 420 may operate non-linearly based on the amplitude of the input signal, and the bootstrap circuit 430 may control the input buffer 420 to operate linearly. In more detail, the bootstrap circuit 430 may maintain, to be consistent, a transconductance property representing a ratio between a change of an input voltage of the input buffer 420 and an output voltage of the input buffer 420.

The bootstrap circuit 430 may reflect a variation of the input signal inputted to a drain node of a p-type metal-oxide-semiconductor field-effect transistor (MOSFET) (PMOS) that functions as the input buffer 420. For example, an alternating current (AC) fluctuation (e.g., an AC component fluctuation) of a gate node, a source node, and the drain node of the input buffer 420 may become identical by the bootstrap circuit 430, such that an effect by a parasitic capacitance may be removed.

In the first circuit 400, a current supplier is represented as variable current sources 450 that control transistors 440, such that currents including differing amplitudes flow in the input buffer 420 in an alternating manner. The current supplier modulates the input signal to a signal of a high frequency. The input buffer 420 outputs the modulated signal to both of the ends of the input resistor 425. A level shifter circuit 460 adjusts a direct current (DC) level, for example, a DC component.

A current flowing in the input resistor 425 is outputted in a form of a voltage in output nodes 470 and 475 of the first circuit 400. The output nodes 470 and 475 of the first circuit 400 are connected to input nodes 510 and 515 of FIG. 5, respectively. Accordingly, a change of a voltage difference applied to both of the ends of the input resistor 425 may be represented at both ends of an output resistor 520 of the second circuit 500 shown in FIG. 5.

FIG. 5 illustrates the second circuit 500 that implements the apparatus that amplifies the signal. The input nodes 510 and 515 of the second circuit 500 are connected to the output nodes 470 and 475 of the first circuit 400 of FIG. 4, respectively. The current flowing in the input resistor 425 of FIG. 4 is mirrored to flow to both branches to which the output resistor 520 is connected in the second circuit 500, and thereby an amplified signal is generated at both ends of the output resistor 520. The amplified signal is outputted via output nodes 530 and 535 of the second circuit 500.

Figure 6:
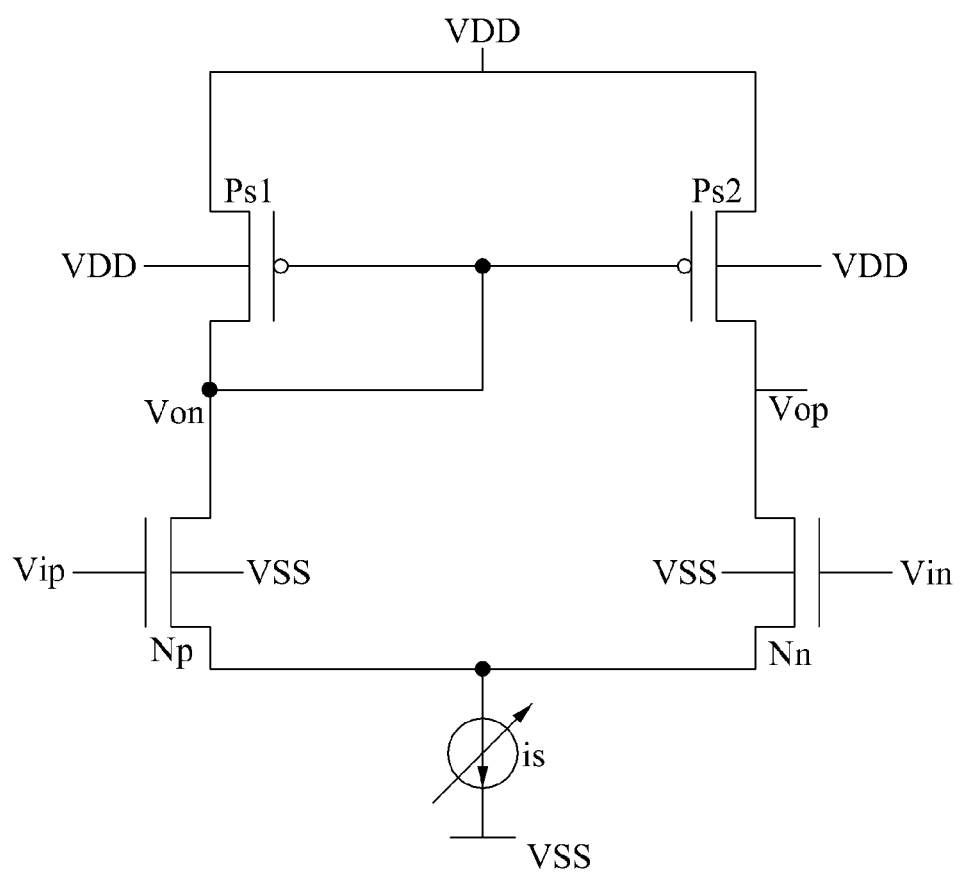
FIG. 6 is a diagram illustrating another example of a circuit that implements an apparatus that amplifies a signal.

FIG. 6 illustrates another example of a circuit that implements an apparatus that amplifies a signal. Referring to FIG. 6, a differential between an input signal Vip and an input signal Vin is amplified by an input transistor Np and an input transistor Nn, and the amplified signal is outputted to a node Vop. In this example, a degree of amplification and a degree of noise of the amplified signal is determined by a variable current source is. When a current run by the variable current source is great, a high quality signal is generated, and when a current run by the variable current source is relatively small, a low quality signal is generated.

Figure 7:
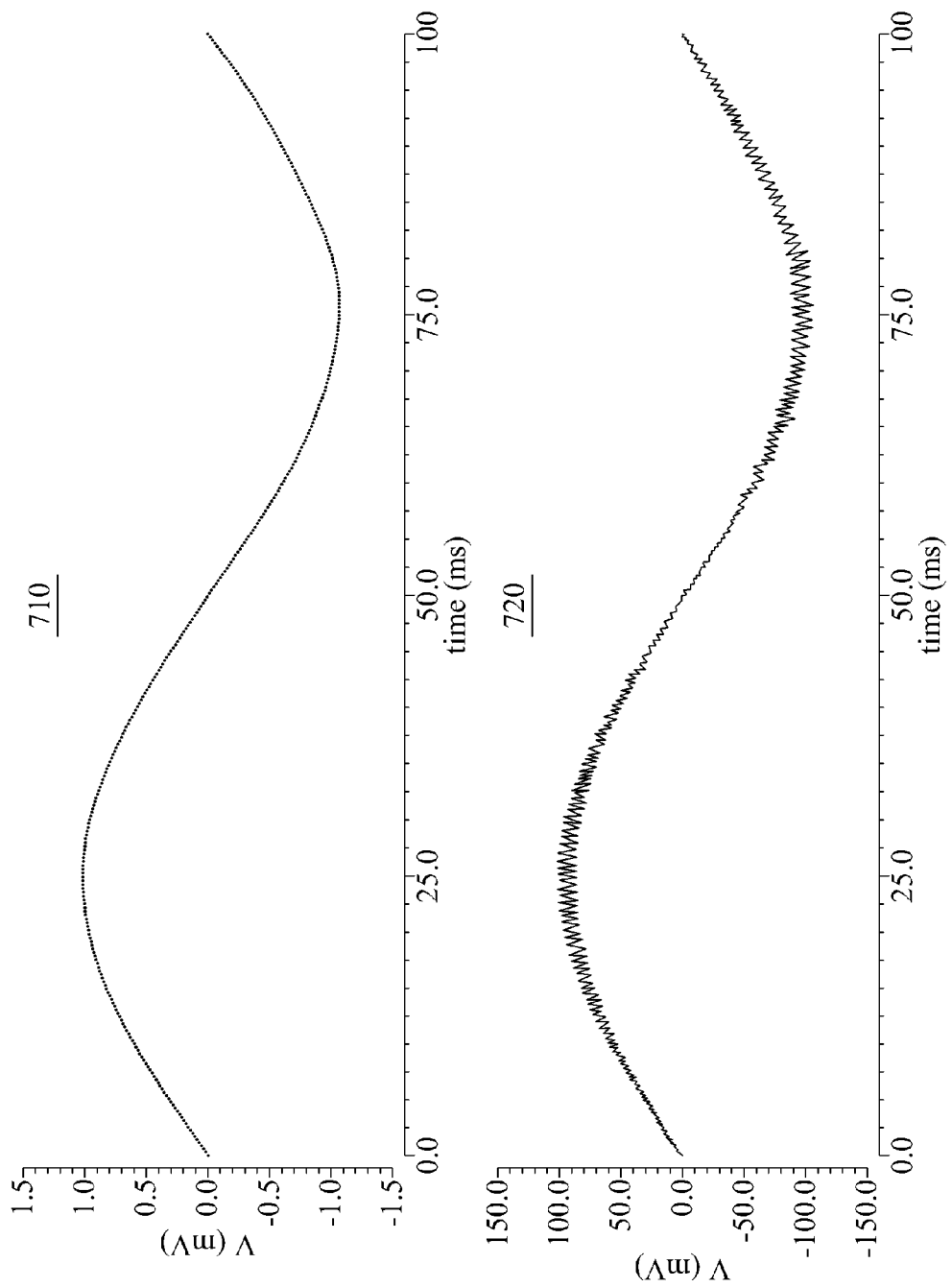
FIG. 7 is a graph illustrating an example of an input signal and an output signal of an apparatus that amplifies a signal.

FIG. 7 illustrates an example of an input signal and an output signal of an apparatus that amplifies a signal. Referring to FIG. 7, a graph 710 is an example of the input signal inputted to the apparatus that amplifies the signal, and illustrates a sine-wave signal of 10 hertz (Hz) of 1 microvolts peak-to-peak (mVpp). In more detail, the graph 710 illustrates a differential between input signals inputted to both input ends of the apparatus that amplifies the signal.

A graph 720 illustrates an example of the output signal to be outputted at both output ends of the apparatus that amplifies the signal, subsequent to amplifying the input signal shown in the graph 710. The graph 720 illustrates a voltage signal of a positive output terminal with respect to a minus output terminal of the apparatus that amplifies the signal. In more detail, the graph 720 illustrates a differential, for example, a differential signal, between output signals to be outputted at both of the output ends of the apparatus that amplifies the signal of which a gain property is 100. The differential between the output signals may indicate a sinewave signal of 10 Hz of 100 mVpp. The apparatus that amplifies the signal may reduce high frequency noise represented in the output signal through a low pass filtering process.

Figure 8:
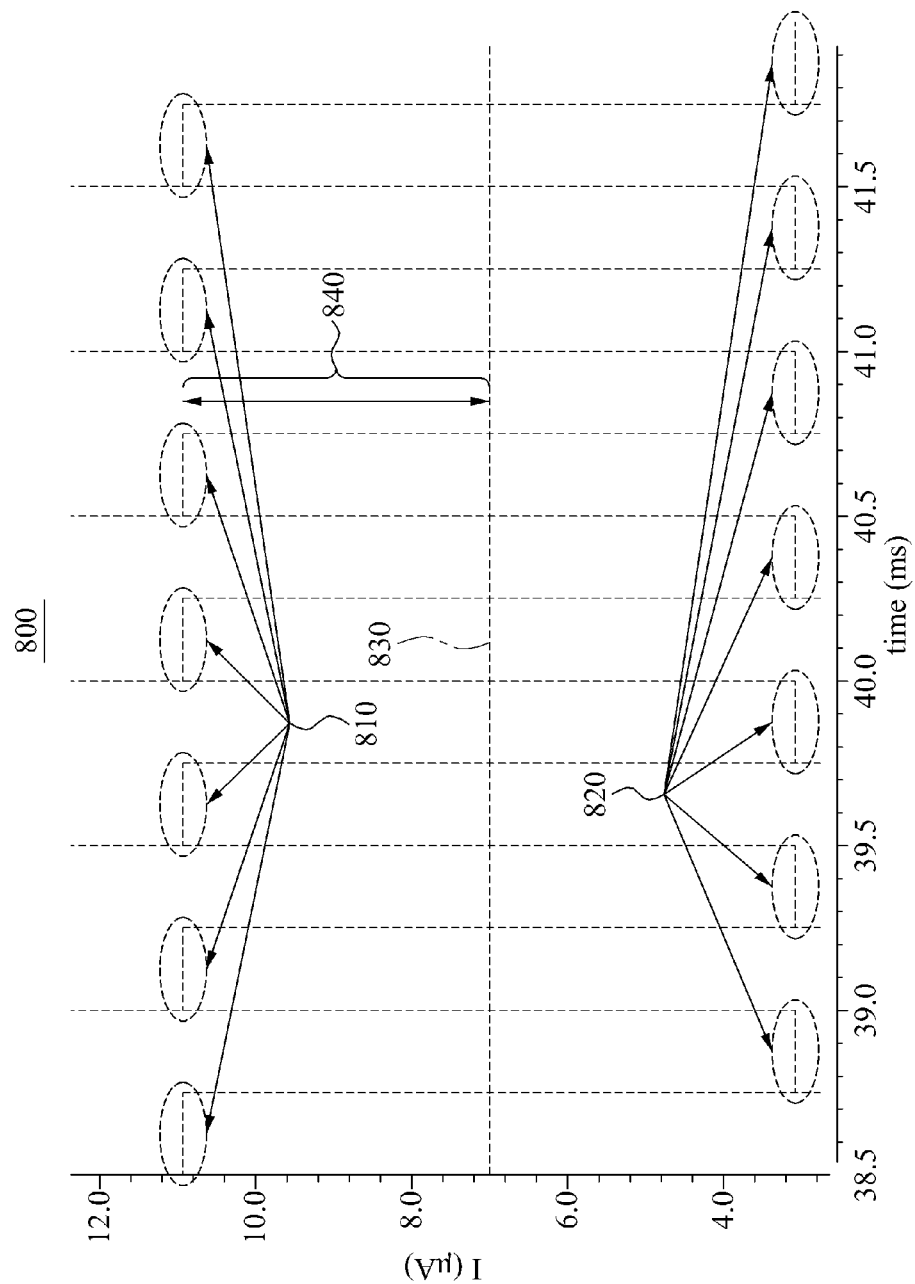
FIG. 8 is a graph illustrating an example of a current consumed by an apparatus that amplifies a signal.

FIG. 8 illustrates an example of a current consumed by an apparatus that amplifies a signal. Referring to FIG. 8, a graph 800 is an example of a simulation result in which an amplitude of the current to be supplied to an internal circuit of the apparatus that amplifies the signal is represented based on a time. The apparatus that amplifies the signal sets a normal interval 810 and a current consumption decrease interval 820, and verifies that the current including differing amplitudes is supplied to the internal circuit at the respective intervals in the graph 800.

The apparatus that amplifies the signal includes a change interval of the current of 0.5 msec. Accordingly, the apparatus that amplifies the signal supplies the current of 11 μA to the internal circuit in the normal interval 810 of 0.25 msec, and supplies the current of 3 μA to the internal circuit in the remaining current consumption decrease interval 820 of 0.25 msec with reference to the graph 800.

The apparatus that amplifies the signal may maintain a high quality signal in a vicinity of a sampling point in time, for example, in the normal interval 810, at which an amplified input signal is sampled. The apparatus that amplifies the signal may output a low quality signal in a remaining interval, for example, in the current consumption decrease interval 820, to reduce an average power consumed by the apparatus that amplifies the signal without an occurrence of a deterioration of an output signal.

As a result, the graph 800 illustrates that the apparatus that amplifies the signal consumes an average current 830 of 7 μA in an entire time interval. The average current consumed is reduced by 4 μA 840 at all times compared to an example of supplying the current of 11 μA in the entire time interval.

The apparatus that amplifies the signal may reduce a power consumed as the average current consumed decreases. Additionally, the apparatus that amplifies the signal may control the power consumed through adjusting a ratio between the normal interval 810 and the current consumption decrease interval 820, or adjusting the amplitude of the current in the current consumption decrease interval 820.

Figure 9:
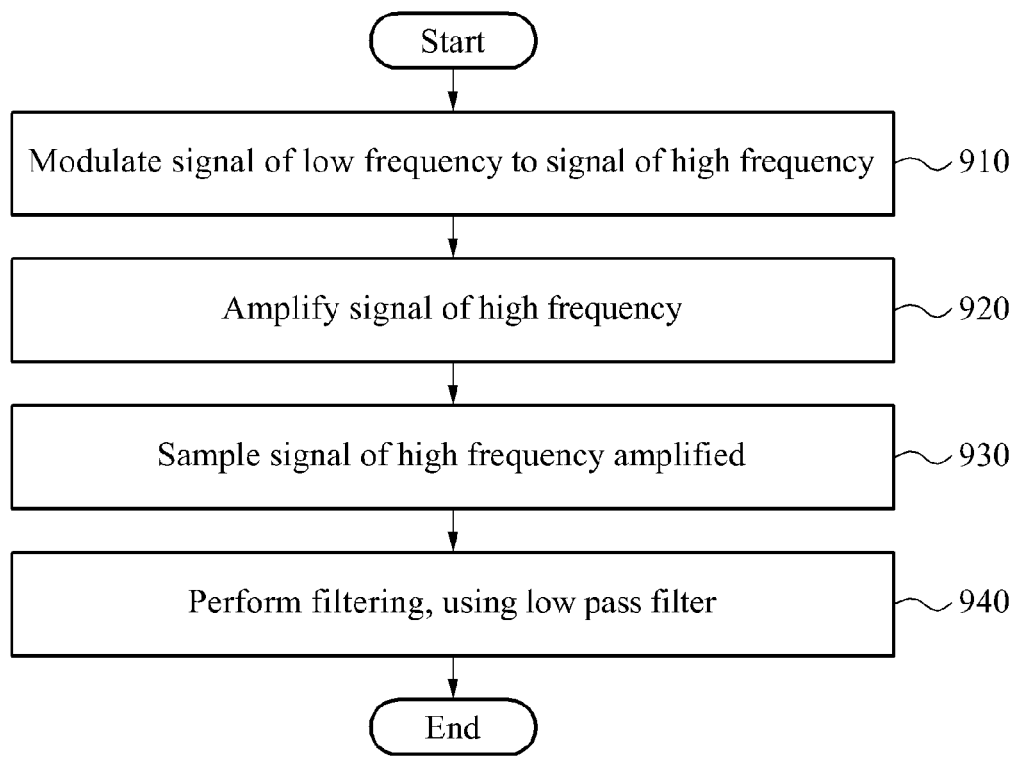
FIG. 9 is a flowchart illustrating an example of a method of amplifying a signal.

FIG. 9 illustrates an example of a method of amplifying a signal. In operation 910, an apparatus that amplifies the signal supplies a periodically variable current to a buffer to modulate a signal of a low or lower frequency to a signal of a high or higher frequency. For example, the apparatus that amplifies the signal may supply currents including differing amplitudes to the buffer, in an alternating manner to modulate the signal of the low frequency to the signal of the high frequency.

The apparatus that amplifies the signal may supply a current of a normal amplitude to the buffer in a predetermined time interval, rather than supply the current of the normal amplitude to the buffer at all times. During another time, the apparatus that amplifies the signal may supply a current of an amplitude less than the normal amplitude, or block the supplying of the current of the normal amplitude.

For example, the apparatus that amplifies the signal may supply a first current and a second current that include differing amplitudes to the buffer, in an alternating manner. An amplitude of the second current may be zero, or less than an amplitude of the first current. The amplitude of the second current being zero may indicate that a current may not be supplied to the buffer at a predetermined time interval. The apparatus that amplifies the signal may adjust the amplitude of the second current, based on a start time, a sampling interval in which an amplified signal is sampled, and/or an operation performance based on an amplitude of a current to be supplied.

The apparatus that amplifies the signal may control an amount of a current to be supplied to the buffer through adjusting a ratio between a duration of supplying the first current to the buffer and a duration of supplying the second current to the buffer. Alternatively, the apparatus that amplifies the signal may control the amount of the current to be supplied to the buffer through adjusting the amplitude of the second current. The apparatus that amplifies the signal may control a power consumed by the apparatus through adjusting the ratio between the duration of supplying the first current to the buffer and the duration of supplying the second current to the buffer, or adjusting the amplitude of the second current.

The apparatus that amplifies the signal may determine a change interval of a current to be supplied to the buffer, based on the sampling interval in which the amplified signal is sampled. For example, the apparatus that amplifies the signal may determine a time interval in which the first current and the second current are supplied to the buffer, based on the sampling interval. Alternatively, the apparatus that amplifies the signal may determine the sampling interval, based on the change interval of the current to be supplied to the buffer.

The apparatus that amplifies the signal may supply the currents including the differing amplitudes to the buffer at regular change intervals of a current to be supplied to the buffer. The regular change intervals of the current may be determined based on the sampling interval in which the signal of the high frequency is sampled. The apparatus that amplifies the signal may reduce an average power consumed by the apparatus without an occurrence of a deterioration of an output signal, through maintaining the signal of the high frequency in a vicinity of a sampling point in time at which the amplified signal is sampled, and outputting a low quality signal during another time.

The apparatus that amplifies the signal may supply the currents including the differing amplitudes to the buffer, using a plurality of transistors having differing properties. For example, the apparatus that amplifies the signal may include the plurality of transistors 440 having the differing properties, and generate the periodically variable current through controlling ON/OFF states of the plurality of transistors 440.

In operation 920, the apparatus that amplifies the signal amplifies the signal of the high frequency. The apparatus that amplifies the signal may amplify the signal of the high frequency, using a current mirror generating a mirrored current. For example, the current mirror may mirror an input current of a high frequency flowing in an input resistor, and output the mirrored current to an output resistor. When the current mirror outputs the mirrored current of an amplitude equal to an amplitude of the input current at both ends of the output resistor, an output signal amplified based on a ratio between the input resistor and the output resistor may be generated at both of the ends of the output resistor, as the amplified signal of the high frequency.

In operation 930, the apparatus that amplifies the signal samples the signal of the high frequency amplified. The apparatus that amplifies the signal may sample the signal of the high frequency amplified, based on regular sampling intervals. Each of the regular sampling intervals may include a predetermined value, or may be determined based on the change interval of the current to be supplied to the buffer. Each of the regular sampling intervals may be identical to the change interval of the current. The apparatus that amplifies the signal may modulate the signal of the high frequency amplified to the signal of the low frequency through the sampling process.

In operation 940, the apparatus that amplifies the signal filters the sampled signal, using an LPF. The apparatus that amplifies the signal may selectively perform a low pass filtering to remove, from the sampled signal, switching noise and/or other noise known to one of ordinary skill in the art, which are generated during the sampling process. A high quality output signal from which noise is removed may be generated through the filtering process.

According to another example, operations 930 and 940 may be performed through the following modifications. A high order harmonic frequency component generated by the periodically variable current of operation 910 may be removed when the output signal in operation 920 passes the LPF. Alternatively, a DC component included in the output signal or a low frequency noise component in operation 920 may be removed, using a high pass filter (HPF). In a following operation, a signal modulated to a high frequency through a sampling and holding process may be demodulated to a low frequency. A carrier frequency component generated by the periodically variable current in operation 910 may be removed, using the LPF, and then an analog signal may be converted to a digital signal, using an analog-to-digital converter (ADC).

The various units, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An amplification apparatus, the apparatus comprising:
an amplifier; and
a current supplier configured to supply a periodically variable current to the amplifier by supplying currents comprising different amplitudes for different durations in an alternating manner,
wherein the amplifier is configured to modulate a signal from a lower frequency to a higher frequency in response to the currents comprising different amplitudes for different durations, and to amplify the modulated signal, and
wherein the current supplier is configured to supply, to the amplifier, a first current and a second current comprising different respective amplitudes in the alternating manner, and an amplitude of the second current is less than an amplitude of the first current.

2. The apparatus of claim 1, wherein the current supplier is configured to supply, to the amplifier, the currents comprising the different amplitudes in an alternating manner, using different transistors.

3. The apparatus of claim 1, wherein the current supplier is configured to determine a change interval of the periodically variable current based on a sampling interval of the amplified signal.

4. The apparatus of claim 1, wherein the first current and the second current in the alternating manner include the amplitude of the second current being zero.

5. The apparatus of claim 1, wherein the current supplier is configured to adjust a ratio between a duration of supplying the first current to the amplifier and a duration of supplying the second current to the amplifier to control an amount of the periodically variable current.

6. The apparatus of claim 1, wherein the current supplier is configured to adjust the amplitude of the second current to control an amount of the periodically variable current.

7. The apparatus of claim 1, wherein the amplifier is configured to:
determine regular sampling intervals based on a change interval of the current; and
sample the amplified signal at the regular sampling intervals.

8. The apparatus of claim 1, wherein the amplifier comprises:
a current mirror comprising an input resistor and an output resistor; and
a buffer configured to output the modulated signal to ends of the input resistor,
wherein the current mirror is configured to
mirror a current flowing in the input resistor, and
output the mirrored current in an output resistor.

9. The apparatus of claim 8, wherein the amplifier is configured to amplify the modulated signal based on a ratio between the output resistor and the input resistor.

10. The apparatus of claim 8, wherein the amplifier further comprises:
a bootstrap circuit connected to the buffer and configured to prevent a property of the buffer from changing.

11. The apparatus of claim 1, wherein a frequency of the periodically variable current is greater than a bandwidth of the signal.

12. An amplification apparatus, the apparatus comprising:
a circuit configured to generate a higher quality analog signal in a time interval adjacent to a time of transitioning from a sampling to a holding of an analog signal, and generate a lower quality analog signal in a remaining time interval, the circuit comprising a current supplier and an amplifier, the current supplier supplying configured to supply, to the amplifier, currents having different durations comprising different amplitudes in an alternating manner, wherein the amplifier, responsive to the currents of the current supplier, modulates a signal from a lower frequency to a higher frequency and amplifies the modulated signal, and wherein the currents with different amplitudes supplied to the amplifier include a first current and a second current in the alternating manner, with an amplitude of the second current being less than an amplitude of the first current.

13. An amplification method, the method comprising:

supplying, to an amplifier, currents comprising different amplitudes for different durations in an alternating manner;

in response to the currents, modulating a signal from a lower frequency to a higher frequency;

amplifying the modulated signal; and sampling the amplified signal, wherein the currents with different amplitudes supplied to the amplifier include a first current and a second current in the alternating manner, with an amplitude of the second current being less than an amplitude of the first current.

14. The method of claim 13, wherein the modulating comprises:

determining regular change intervals based on a sampling interval of the amplified signal.

15. The method of claim 13, wherein the signal is modulated using transistors comprising differing properties.

16. The method of claim 13, wherein the amplifying comprises:

amplifying the modulated signal, using a current mirror mirroring a current corresponding to the modulated signal.

17. The method of claim 13, wherein the sampling comprises:

determining regular sampling intervals based on a change interval of the currents; and sampling the amplified signal at the regular sampling intervals.

18. The method of claim 13, further comprising:

filtering the sampled signal, using a low pass filter.

19. An apparatus comprising:

an amplifier configured to modulate a signal from a lower frequency to a higher frequency in response to a periodically variable current, and amplify the modulated signal; and a current supplier configured to supply, to the amplifier, the periodically variable current by supplying currents comprising different amplitudes for different durations in an alternating manner to the amplifier to implement the modulating of the signal, and wherein the currents with different amplitudes supplied to the amplifier include a first current and a second current in the alternating manner, with an amplitude of the second current being less than an amplitude of the first current.

20. The apparatus of claim 19, wherein the amplifier is further configured to:

sample the amplified signal to modulate the amplified signal to the lower frequency.

21. The apparatus of claim 20, wherein the periodically variable current comprises the first current being supplied in a sampling time interval in which the amplified signal is sampled, and the second current being supplied in a remaining time interval.

* * * * *